United States Patent Office 3,520,684

Patented July 14, 1970

3,520,684

PHOTOLYTIC ETCHING OF SILICON DIOXIDE BY ACIDIFIED ORGANIC FLUORIDES

Max Metlay and Donald L. Schaefer, Schenectady, N.Y., assignors to General Electric Company, a corporation of New York No Drawing. Filed May 29, 1967, Ser. No. 642,128
Int. Cl. G03c 5/00
U.S. Cl. 96—36 3 Claims

ABSTRACT OF THE DISCLOSURE

A process is disclosed whereby a surface composed of silicon dioxide is overcoated with a liquid comprising a photodecomposable organic fluorine compound and a strong mineral acid and the interface formed by the solid surface and the film is exposed to a pattern of activating radiation, whereupon chemically reactive species are formed in the irradiated areas which preferentially etch the silicon dioxide surface in the irradiated areas producing an etched pattern corresponding to the pattern of radiation.

The invention herein described was made in the course of or under a contract with the Bureau of Ships, United States Navy.

Attention is drawn at this point to the patent applications of Donald L. Schaefer, Ser. No. 642,159, now U.S. Pat. No. 3,489,564, granted Jan. 13, 1970, entitled "Photolytic Etching of Silicon Dioxide" and Ser. No. 642,201, entitled "Etching of Silicon Dioxide by Photosensitive Solutions" filed concurrently herewith and assigned to the assignee of the present invention.

BACKGROUND OF THE INVENTION

In the past when it has been desired to etch the surface of glass or quartz materials for either decorative or optical purposes, or to etch patterns through silicon dioxide surface films formed on the surfaces of so-called silicon "chips" for use as semiconductive circuit elements in miniaturized "integrated" circuits, it has been necessary to coat those surface areas which are not to be etched with a protective layer of a material which is resistant to the etchant, leaving exposed those areas which are to be etched. The etchant, usually hydrofluoric acid or a solution with ammonium fluoride is then applied to those exposed areas. When a high degree of precision is necessary in forming the etched pattern, as, for example, in the manufacture of optical reticles or in the manufacture of silicon chips, it has been conventional to use a suitable "photoresist" process. In general, these processes have involved coating the surface to be etched with a material which, when suitably irradiated, is converted from a soluble to an insoluble form. In practice, the surface to be etched is coated with the material, exposed to the desired pattern of activating radiation through an appropriate photographic transparency, for example, and the unexposed still soluble areas of the coating removed by washing with an appropriate solvent, leaving behind the insoluble coating covering the surface areas which were exposed. The unprotected areas of the surface may then be etched with the etchant, after which the photoresist mask is removed. It will be apparent that this process has several inherent disadvantages. The photolytic reaction of the photoresist materials usually involves a polymerization or cross-linking type of reaction and the edge resolution between reacted and unreacted zones is frequently of uncertain quality and may be difficult to reproduce with a high degree of accuracy from one specimen to another. Considerable care must be exercised during the washing and etching steps to prevent the insoluble portions of the photoresist pattern from lifting from the surface, yet all the soluble material must be removed. Undercutting of the insoluble pattern by the etchant is unavoidable and virtually impossible to control which introduces variations between successively etched patterns. The etchants conventionally employed in the etching of silicon dioxide are toxic and in the case of hydrofluoric acid, are extremely dangerous to handle and use. It would be advantageous to eliminate the necessity for the use of the photoresist materials, the multiple step process attendant therewith and the use of the hazardous etchants.

It is therefore a principal object of this invention to provide a process for etching predetermined patterns in surfaces composed essentially of silicon dioxide which does not require the use of a mask of the photoresist type or the use of etchants containing hydrofluoric acid.

It is a further object of this invention to provide a method for the selective etching of a silicon dioxide surface at controllably different rates in different zones thereof simultaneously.

Other and specifically different objects of this invention will become apparent to those skilled in the art from the following disclosure.

SUMMARY OF THE INVENTION

Briefly stated, this invention provides a method for the selective etching of surfaces composed primarily of silicon dioxide by covering said surfaces with a liquid layer which contains a photodecomposable organic fluorine compound and a source of hydrogen ions such as, for example, a strong mineral acid, exposing selected areas of the etchant-to-solid interface to activating radiation to photolytically decompose the organic fluorine compound to form chemically reactive species which attack and etch the surface in areas exposed to radiation during the time said areas are irradiated. The rate at which said areas are attacked is dependent at least in part to the concentration of said chemically reactive species which is dependent in part upon the intensity of the incident radiation.

DESCRIPTION OF THE PREFERRED EMBODIMENTS

It was observed that many organic fluorocarbon compounds in liquid systems were capable of being photolytically decomposed by breaking the fluorine bond but that no effective etching of silicon dioxide surfaces was produced. For example, a silicon chip having a surface composed of silicon dioxide about 6000 A. in thickness was overcoated with a surface film of 1-fluorodecane and exposed to a pattern of radiation from a 1000-watt high intensity mercury lamp for four hours without any evidence of etching. When about 50 percent by volume concentrated hydrochloric acid was added to the 1-fluorodecane and similarly exposed, the illuminated areas of the silicon dioxide surface coating were etched through in about 15 minutes. Similarly, fluorocarbon compounds such as fluorosulfonyl benzene sulfonyl chloride in methanol, monofluoroacetone in water, 4,4′-fluorobenzophenone in methanol and methane sulfonyl fluoride in water all were ineffective as photolytic etchants of silicon dioxide, but when a strong mineral acid was added thereto these liquids provided effective etching action. In these examples, where a solvent is used, the fluorocarbon compounds are present up to their limits of solubility.

From the foregoing it will be seen that silicon dioxide surfaces may be efficiently etched in a desired pattern by contacting the surface with a liquid comprising a photodecomposable fluorocarbon compound and a strong mineral acid and exposing the liquid to solid interface with a pattern of activating radiation, whereby said fluorocarbon compound is photolytically decomposed to produce chemically reactive species which, in the presence of said acids, reacts with and attacks said surface in the illuminated areas to etch said surface. It should also be noted that the bond dissociation energy of the fluorine bond of the photodecomposable fluorine containing compound should be less that about 150 kilocalories per mole for efficient etching.

While the foregoing disclosure has been restricted to the use of liquid etchants, it will be apparent to those skilled in the art that solid polymer films containing the photodecomposable fluorine compound and the acid may be used. For example, such a film may be prepared utilizing water soluble polyvinyl alcohol as the polymer with monofluoroacetone and sulfuric acid.

From the foregoing it will be appreciated that the several liquid systems which are photodecomposable to produce chemically reactive species which in the presence of strong mineral acids etch silicon dioxide are to be considered exemplary only and it is not intended that the scope of the invention be limited thereto or in any other manner except as set forth in the following claims.

What we claim as new and desire to secure by Letters Patent of the United States is:

1. In a method for photoetching a surface composed primarily of silicon dioxide, the steps of contacting said surface with a liquid etchant comprising a photolytically dissociable fluorine containing compound an effective amount by volume up to about 50% of a strong mineral acid, said compound being photolytically dissociable to produce chemically reactive species which, in the presence of said acid, chemically attack silicon dioxide, wherein said photolytically dissociable containing compound is selected from the group consisting of 1-fluorodecane, fluorosulfonyl benzene, sulfonyl chloride, monofluoroacetone, 4,4′-fluorobenzophenone and methane sulfonyl fluoride, and exposing said surface at the etchant-to-solid interface to a pattern of activating radiation to produce said chemically reactive species which attack and etch said surface in the irradiated areas.

2. The method of claim 1 wherein said mineral acid is hydrochloric acid.

3. The method of claim 1 wherein said mineral acid is sulfuric acid.

References Cited

UNITED STATES PATENTS

| | | | |
|---|---|---|---|
| 2,841,477 | 7/1958 | Hall | 204—157.1 X |
| 2,875,046 | 2/1959 | Marron et al. | 96—36 X |
| 3,255,005 | 6/1966 | Green | 96—36 |
| 3,271,180 | 9/1966 | White | 96—36 X |
| 3,346,384 | 10/1967 | Gaynor | 96—36 |
| 3,122,463 | 2/1964 | Ligenza et al. | 158—16 |

GEORGE F. LESMES, Primary Examiner

R. E. MARTIN, Assistant Examiner

U.S. Cl. X.R.

96—36.2; 156—4, 17